(12) United States Patent
Fosnight et al.

(10) Patent No.: US 7,101,138 B2
(45) Date of Patent: Sep. 5, 2006

(54) EXTRACTOR/BUFFER

(75) Inventors: William John Fosnight, Carlisle, MA (US); Michael Bufano, Belmont, MA (US); Gerald Friedman, New Ipswich, NH (US); Robert Sullivan, Wilmington, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 224 days.

(21) Appl. No.: 10/727,353

(22) Filed: Dec. 3, 2003

(65) Prior Publication Data

US 2005/0135906 A1    Jun. 23, 2005

(51) Int. Cl.
*B65G 65/02* (2006.01)

(52) U.S. Cl. .................... 414/222.11; 414/222.09; 414/278; 414/806; 414/940; 198/597

(58) Field of Classification Search .......... 414/222.09, 414/222.11, 222.12, 278, 280, 940, 392, 393, 414/806; 198/597, 598
See application file for complete search history.

(56) References Cited

U.S. PATENT DOCUMENTS

| | | | | |
|---|---|---|---|---|
| 4,181,214 A * | 1/1980 | Szasz et al. | .............. | 198/463.3 |
| 4,200,178 A * | 4/1980 | Gunti | ..................... | 198/370.1 |
| 4,256,222 A * | 3/1981 | Gunti | .................... | 198/457.02 |
| 4,311,427 A | 1/1982 | Coad et al. | .................. | 414/217 |
| 4,457,661 A | 7/1984 | Flint et al. | ................... | 414/404 |
| 4,483,651 A * | 11/1984 | Nakane et al. | .............. | 414/217 |
| 4,492,504 A * | 1/1985 | Hainsworth | ................ | 414/273 |
| 4,540,326 A | 9/1985 | Southworth et al. | ........ | 414/217 |
| 4,541,520 A * | 9/1985 | Greenlee, III | ............. | 198/370.1 |
| 4,668,484 A | 5/1987 | Elliott | ........................ | 422/113 |
| 4,682,927 A | 7/1987 | Southworth et al. | ........ | 414/217 |
| 4,730,718 A * | 3/1988 | Fazio et al. | .............. | 198/370.1 |
| 4,775,281 A | 10/1988 | Prentakis | ..................... | 414/416 |
| 4,776,744 A | 10/1988 | Stonestreet et al. | ......... | 414/217 |
| 4,816,116 A | 3/1989 | Davis et al. | ................ | 156/643 |
| 4,886,412 A | 12/1989 | Wooding et al. | ........... | 414/416 |
| 4,903,610 A | 2/1990 | Matsumoto et al. | ........ | 104/118 |
| 5,064,337 A | 11/1991 | Asakawa et al. | ........... | 414/639 |
| 5,256,222 A * | 10/1993 | Shepherd et al. | ............. | 156/41 |
| 5,324,155 A | 6/1994 | Goodwin et al. | ........... | 414/225 |
| 5,417,537 A | 5/1995 | Miller | ........................ | 414/217 |
| 5,615,988 A | 4/1997 | Wiesler et al. | .............. | 414/416 |
| 5,647,718 A | 7/1997 | Wiesler et al. | .............. | 414/416 |
| 5,741,109 A | 4/1998 | Wiesler et al. | .............. | 414/416 |
| 5,751,581 A | 5/1998 | Tau et al. | .................... | 364/468 |
| 5,893,795 A | 4/1999 | Perlov et al. | ............... | 451/288 |
| 5,947,802 A | 9/1999 | Zhang et al. | ................ | 451/334 |
| 5,957,648 A * | 9/1999 | Bachrach | .................... | 414/217 |

(Continued)

FOREIGN PATENT DOCUMENTS

EP    1063056 A2    12/2000

(Continued)

*Primary Examiner*—James Keenan
(74) *Attorney, Agent, or Firm*—Weingarten, Schurgin, Gagnebin & Lebovici LLP

(57) ABSTRACT

An automated material handling system that includes an extractor/buffer apparatus capable of simultaneously accessing multiple Work-In-Process (WIP) parts, thereby providing a highly efficient interface between WIP storage locations and transport equipment. The extractor/buffer apparatus includes multiple extractor/buffer modules, each module being configured to interface with a location for holding WIP parts that is a number of WIP parts deep. Each module includes a platform for holding multiple WIP parts. Further, multiple modules may be disposed side-by-side to form an extractor/buffer apparatus capable of handling multiple rows of WIP parts.

39 Claims, 6 Drawing Sheets

U.S. PATENT DOCUMENTS

| | | | |
|---|---|---|---|
| 5,980,183 A | 11/1999 | Fosnight | 414/222.01 |
| 5,993,148 A | 11/1999 | Brown | 414/810 |
| 6,002,840 A | 12/1999 | Hofmeister | 395/80 |
| 6,035,245 A | 3/2000 | Conboy et al. | 700/214 |
| 6,050,768 A | 4/2000 | Iwasaki et al. | 414/222.01 |
| 6,078,845 A | 6/2000 | Friedman | 700/104 |
| 6,086,457 A | 7/2000 | Perlov et al. | 451/41 |
| 6,095,054 A | 8/2000 | Kawano et al. | 104/139 |
| 6,129,496 A | 10/2000 | Iwasaki et al. | 414/222.01 |
| 6,303,398 B1 | 10/2001 | Goerigk | 438/14 |
| 6,308,818 B1 | 10/2001 | Bonora et al. | 198/465.1 |
| 6,315,512 B1 | 11/2001 | Tabrizi et al. | 414/217 |
| 6,356,804 B1 | 3/2002 | Conboy et al. | 700/228 |
| 6,361,422 B1 | 3/2002 | Ettinger et al. | 451/339 |
| 6,364,593 B1 | 4/2002 | Hofmeister et al. | 414/217.1 |
| 6,594,546 B1 | 7/2003 | Elger | 700/225 |
| 6,604,624 B1 * | 8/2003 | Hirata et al. | 198/494 |
| 6,670,568 B1 | 12/2003 | Goetzke | 209/567 |
| 6,877,943 B1 * | 4/2005 | Lehrieder et al. | 414/278 |
| 2001/0014268 A1 | 8/2001 | Bryson, III et al. | 414/217 |
| 2002/0025244 A1 | 2/2002 | Kim | 414/217 |
| 2003/0185656 A1 * | 10/2003 | Hansl | 414/277 |
| 2005/0158158 A1 * | 7/2005 | Porta | 414/392 |

FOREIGN PATENT DOCUMENTS

| | | | |
|---|---|---|---|
| JP | 5-47896 | * | 2/1993 |
| WO | WO 99/02436 | | 1/1999 |

* cited by examiner

EXTRACTOR/BUFFER

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present application relates generally to automated material handling systems, and more specifically to an automated material handling system including an improved extractor/buffer apparatus that provides a highly efficient interface between storage locations and transport equipment for Work-In-Process (WIP) parts.

Automated material handling systems are known that employ WIP storage units and transport equipment to store WIP parts and to move them between workstations and/or processing machines in a product manufacturing environment. For example, such an automated material handling system may be employed in the fabrication of Integrated Circuit (IC) chips. A typical process of fabricating IC chips includes various processing steps such as deposition, cleaning, ion implantation, etching, and passivation steps. Each of these steps in the IC chip fabrication process may be performed by a different processing machine such as a chemical vapor deposition chamber, an ion implantation chamber, or an etcher. Further, the WIP parts, in this case, semiconductor wafers, are typically moved between the different workstations and/or processing machines multiple times to perform the various steps required for fabricating the IC chips.

A conventional automated material handling system used in an IC chip fabrication process comprises a plurality of WIP storage units for storing semiconductor wafers, and transport equipment including overhead hoists and conveyors for moving the wafers between the storage units, workstations, and processing machines on the IC chip manufacturing floor. The wafers are typically loaded into carriers such as Front Opening Unified Pods (FOUPs), each of which may be selectively accessed via an overhead hoist traveling on a suspended track. In a typical system configuration, the FOUPs are accessed by overhead hoists from locations underneath the track. Accordingly, each overhead hoist is typically moved along the suspended track to a position directly above a selected location, lowered toward the selected location, and operated to pick/place a FOUP from/to that location.

In the conventional automated material handling system, overhead hoists are employed to move FOUPs relatively short distances while conveyors are employed to move the FOUPs longer distances across the IC chip manufacturing floor. For example, a conveyor used in an IC chip manufacturing environment may comprise a conveyor belt, or a platform configured to travel along a rail. In the typical system configuration, overhead hoists may be employed to pick/place respective FOUPs from/to one or more conveyors. The overhead hoists may also be used to pick respective FOUPs from the conveyors and to place the FOUPs to input/output ports of a workstation or processing machine, and vice versa. The overhead hoists typically access the FOUPs from the conveyors positioned underneath the suspended track.

One drawback of the above-described conventional automated material handling system is that each overhead hoist employed therein typically picks/places only one FOUP at a time. This can significantly impede throughput in a system capable of handling hundreds of FOUPs. Further, each overhead hoist typically accesses just a single level of storage underneath the suspended track. This is also problematic because providing only one level of WIP storage on the product manufacturing floor can increase costs due to the inefficient use of floor space. To access multiple levels of storage underneath the track, storage units must typically be configured to move a selected FOUP from its current position within the storage unit to a position at the level accessible to the overhead hoist, thereby further impeding the system throughput. In addition, such storage units typically have many moving parts such as rollers, bearings, and motors that are subject to failure, which not only increases costs but also diminishes the reliability of the overall system.

Moreover, because the overhead hoists are typically configured to access FOUPs from locations underneath the suspended track, a minimum amount of space is required between the ceiling and floor of the IC chip manufacturing facility to accommodate the track and the overhead hoist. This further limits the amount of space in the manufacturing facility that might otherwise be used for storing semiconductor wafers. In addition, because only one level of storage is accessible to each overhead hoist, multiple overhead hoists must normally queue up at a storage unit to access FOUPs from that storage unit, thereby further lowering system throughput.

It would therefore be desirable to have an automated material handling system that provides enhanced material handling efficiency while overcoming the drawbacks of conventional automated material handling systems.

BRIEF SUMMARY OF THE INVENTION

In accordance with the present invention, an automated material handling system is provided that includes an improved extractor/buffer apparatus capable of simultaneously accessing multiple Work-In-Process (WIP) parts, thereby providing a highly efficient interface between WIP storage locations and transport equipment. The presently disclosed extractor/buffer apparatus achieves such benefits while interfacing with WIP storage locations and transport equipment disposed beside the extractor/buffer.

In one embodiment, the improved extractor/buffer apparatus comprises a plurality of extractor/buffer modules, in which each extractor/buffer module is configured to interface with a location for holding WIP parts that is a number of WIP parts deep. Each extractor/buffer module includes a substantially planar platform configured to hold multiple adjacent WIP parts. Further, multiple extractor/buffer modules may be disposed side-by-side, thereby forming an extractor/buffer apparatus capable of holding multiple rows of WIP parts.

In the preferred embodiment, each extractor/buffer module includes a substantially planar platform for holding two adjacent WIP parts (a "double nest" platform), two elongated extractor arms longitudinally disposed along opposing edges of the double nest platform, a drive mechanism for simultaneously and axially translating the extractor arms, independent lifting mechanisms for lifting respective WIP parts on the extractor arms, and independent roller mechanisms for moving one or both of the WIP parts transverse to the extractor arm translation axis. Further, multiple extractor/buffer modules are disposed side-by-side, thereby forming an extractor/buffer apparatus capable of holding two rows of WIP parts. The extractor/buffer apparatus interfaces with WIP storage units and transport equipment disposed beside the extractor/buffer apparatus.

In the presently disclosed embodiment, each extractor/buffer module is operative (1) to move two WIP parts from a two-WIP part deep storage location to the double nest platform, and to move the two WIP parts back to their original sites in the storage location, (2) to move a first WIP part from the site in the storage location farthest from the extractor/buffer module to the site on the double nest platform farthest from the storage location, and to move the first WIP part back to its original site in the storage location, (3) to move the first WIP part from the site in the storage location farthest from the extractor/buffer module to the site on the double nest platform closest to the storage location, and to move the first WIP part back to its original site in the storage location or to the site in the storage location closest to the extractor/buffer module, (4) in the event there is no WIP part disposed at the site in the storage location farthest from the extractor/buffer module, to move a second WIP part from the site in the storage location closest to the extractor/buffer module to the site on the double nest platform closest to the storage location, (5) in the event there is no WIP part disposed at the site in the storage location closest to the extractor/buffer module, to move the first WIP part from the site in the storage location farthest from the extractor/buffer module to the site in the storage location closest to the extractor/buffer module, and (6) in the event there is no WIP part disposed at the site in the storage location farthest from the extractor/buffer module, to move the second WIP part from the site in the storage location closest to the extractor/buffer module to the site in the storage location farthest from the extractor/buffer module. Each extractor/buffer module is further operative to perform at least the above-described movements of WIP parts between corresponding locations on the double nest platform and on transport equipment.

Moreover, the extractor/buffer apparatus including the plurality of extractor/buffer modules is operative to move one or more WIP parts laterally from respective locations on the double nest platform of at least one first extractor/buffer module to corresponding locations on the double nest platform of an adjacent extractor buffer module. After performing such lateral movements of WIP parts, the extractor/buffer apparatus is further operative to move the WIP parts from their new locations on the double nest platforms to corresponding sites in a plurality of storage locations of a WIP storage unit, thereby repositioning the WIP parts within the storage unit.

By simultaneously accessing multiple WIP parts from storage locations and/or transport equipment disposed beside the extractor/buffer apparatus, a highly efficient interface between the WIP storage locations and transport equipment is achieved.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

U.S. patent application Ser. No. 10/393,526 filed Mar. 20, 2003 entitled AUTOMATED-MATERIAL HANDLING SYSTEM FOR SEMICONDUCTOR MANUFACTURING BASED ON A COMBINATION OF VERTICAL CAROUSELS AND OVERHEAD HOISTS, and U.S. patent application Ser. No. 10/682,809 filed Oct. 9, 2003 entitled ACCESS TO ONE OR MORE LEVELS OF MATERIAL STORAGE SHELVES BY AN OVERHEAD HOIST TRANSPORT VEHICLE FROM A SINGLE TRACK POSITION are incorporated herein by reference.

An automated material handling system is disclosed including an improved extractor/buffer apparatus that can simultaneously access multiple Work-In-Process (WIP) parts disposed at locations beside the extractor/buffer apparatus. The presently disclosed extractor/buffer apparatus provides a highly efficient interface between WIP storage locations and transport equipment employed in a product manufacturing environment.

Figure 1:
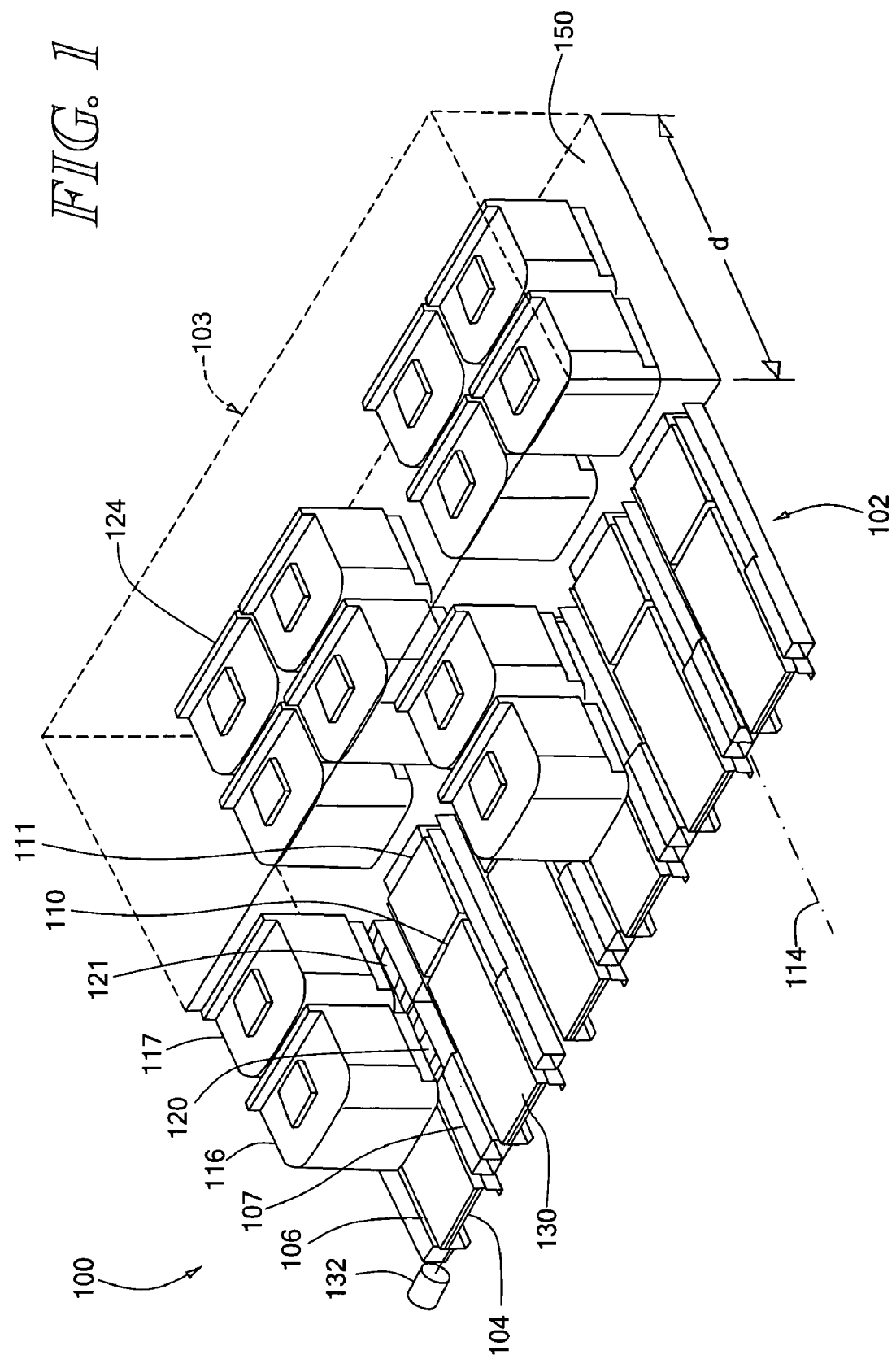
FIG. 1 is a perspective view of an automated material handling system including an improved extractor/buffer apparatus according to the present invention.

FIG. 1 depicts an illustrative embodiment of an Automated Material Handling System (AMHS) 100, in accordance with the present invention. In the illustrated embodiment, the AMHS 100 includes an extractor/buffer assembly 102, and a WIP storage unit 103 disposed at a location beside the extractor/buffer assembly 102. It is noted that the AMHS 100 may be employed in a clean-room environment for manufacturing Integrated Circuit (IC) chips such as a 200 mm or 300 mm wafer FAB plant. Accordingly, the WIP parts may comprise semiconductor wafers disposed in carriers such as Front Opening Unified Pods (FOUPs) 116–117. Further, the WIP storage unit 103 may comprise a conventional stocker, a vertical carousel storage unit, a storage bin such as a fixed shelf, or any other suitable apparatus or structure for storing the FOUPs. It should be understood, however, that the AMHS 100 may be employed in any suitable product manufacturing environment.

It is noted that illustrative embodiments of vertical carousel storage units and storage bins such as the fixed shelf are described in the above-referenced U.S. patent application Ser. No. 10/393,526 and U.S. patent application Ser. No. 10/682,809, respectively.

As shown in FIG. 1, the WIP storage unit 103 is configured to store a plurality of FOUPs 124. In the presently disclosed embodiment, the WIP storage unit 103 includes a substantially planar storage bin 150 configured to hold two rows of FOUPs, each row being substantially parallel to the length of the extractor/buffer assembly 102. Accordingly, the WIP storage unit 103 has a depth d equal to about the distance occupied by two adjacent FOUPs. It is appreciated, however, that the WIP storage unit 103 may be configured to hold an array of FOUPs having any suitable number of rows and columns. Further, a storage unit like the WIP storage unit 103 may be disposed on either side or on both sides of the extractor/buffer assembly 102 based on the storage requirements of the product manufacturing facility.

Figure 4:
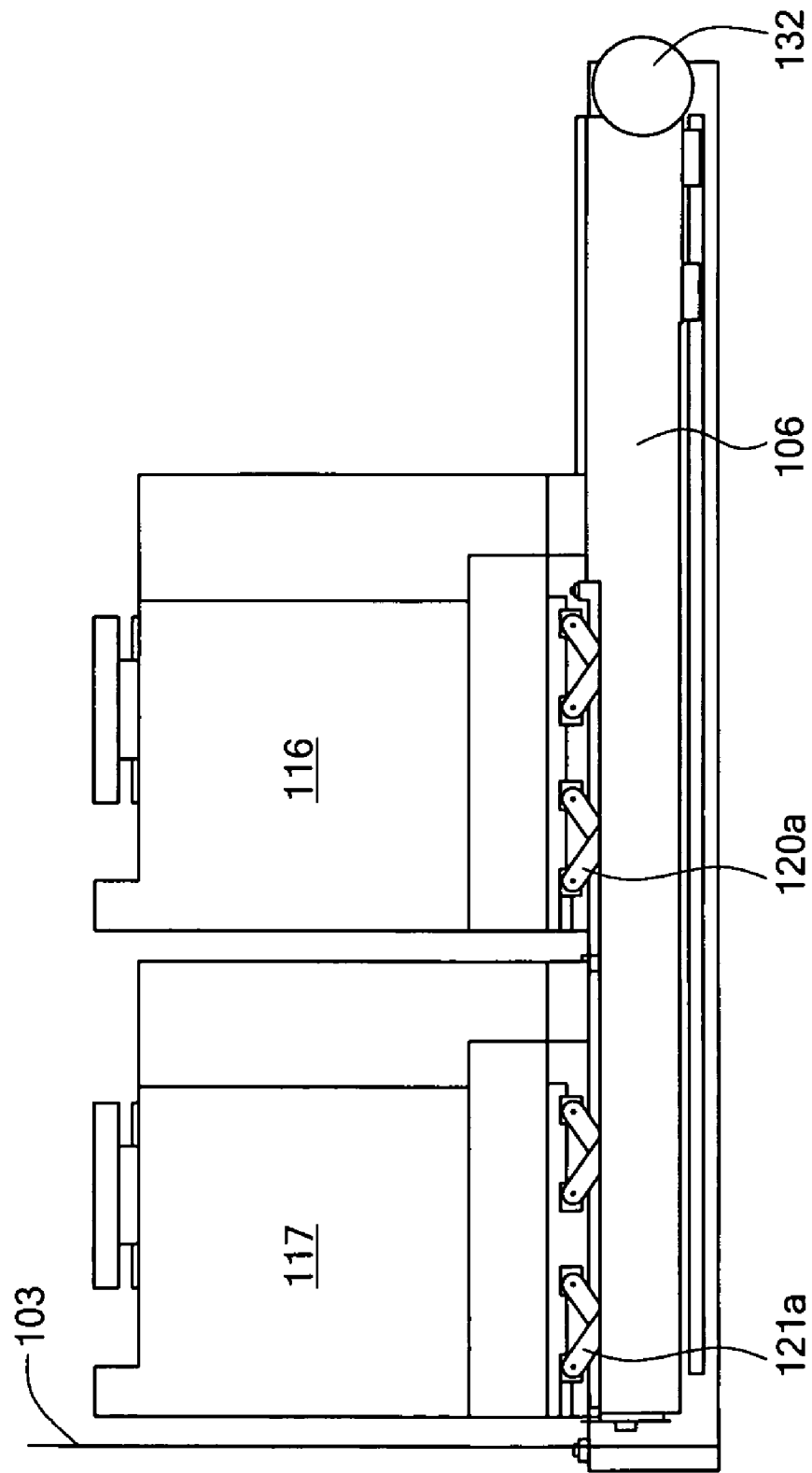
FIG. 4 is a side view of the extractor/buffer apparatus of FIG. 1, illustrating an extractor arm and a plurality of lifting mechanisms.
Figure 5A:
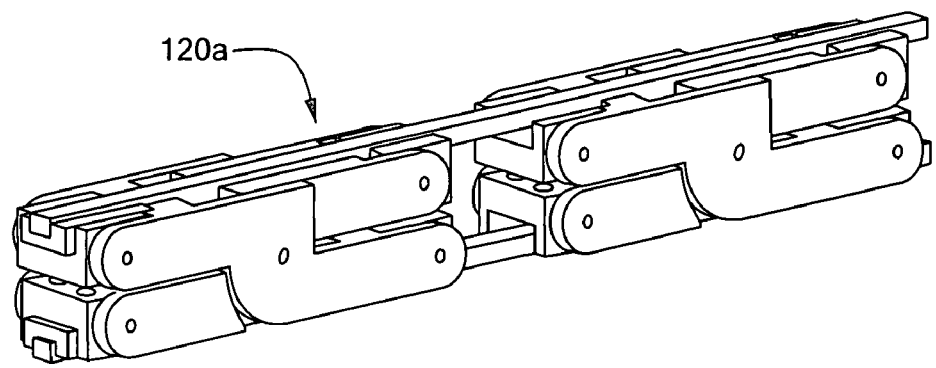
FIGS. 5*a*–5*b* are perspective views of a representative lifting mechanism included in the extractor/buffer apparatus of FIG. 1, illustrating the lifting mechanism in non-lifting and lifting configurations, respectively.
Figure 5B:
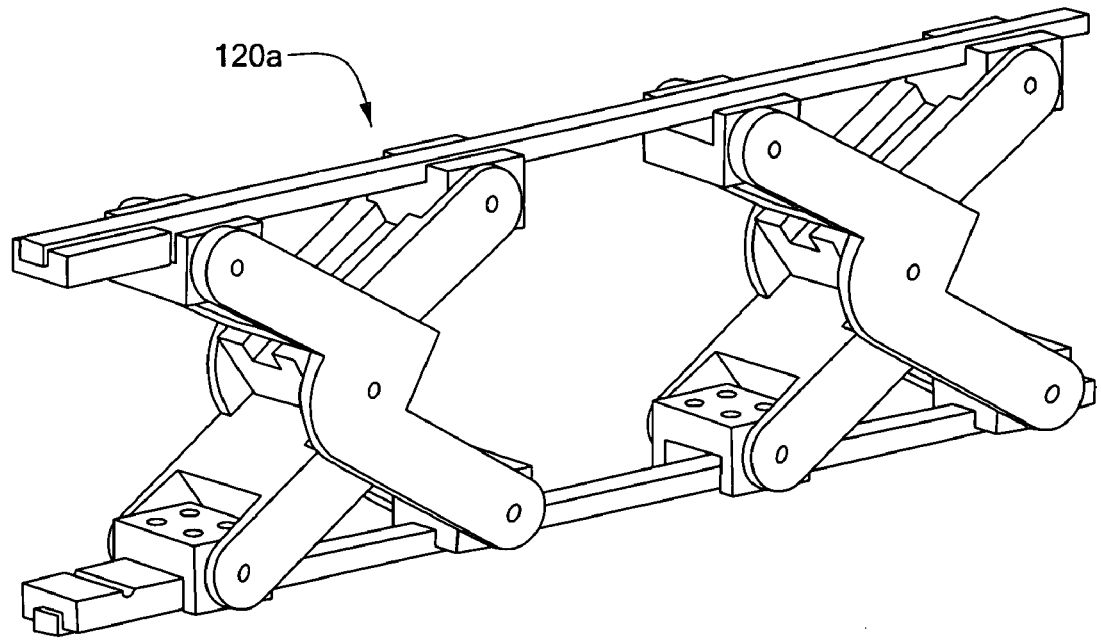
Figure 6:
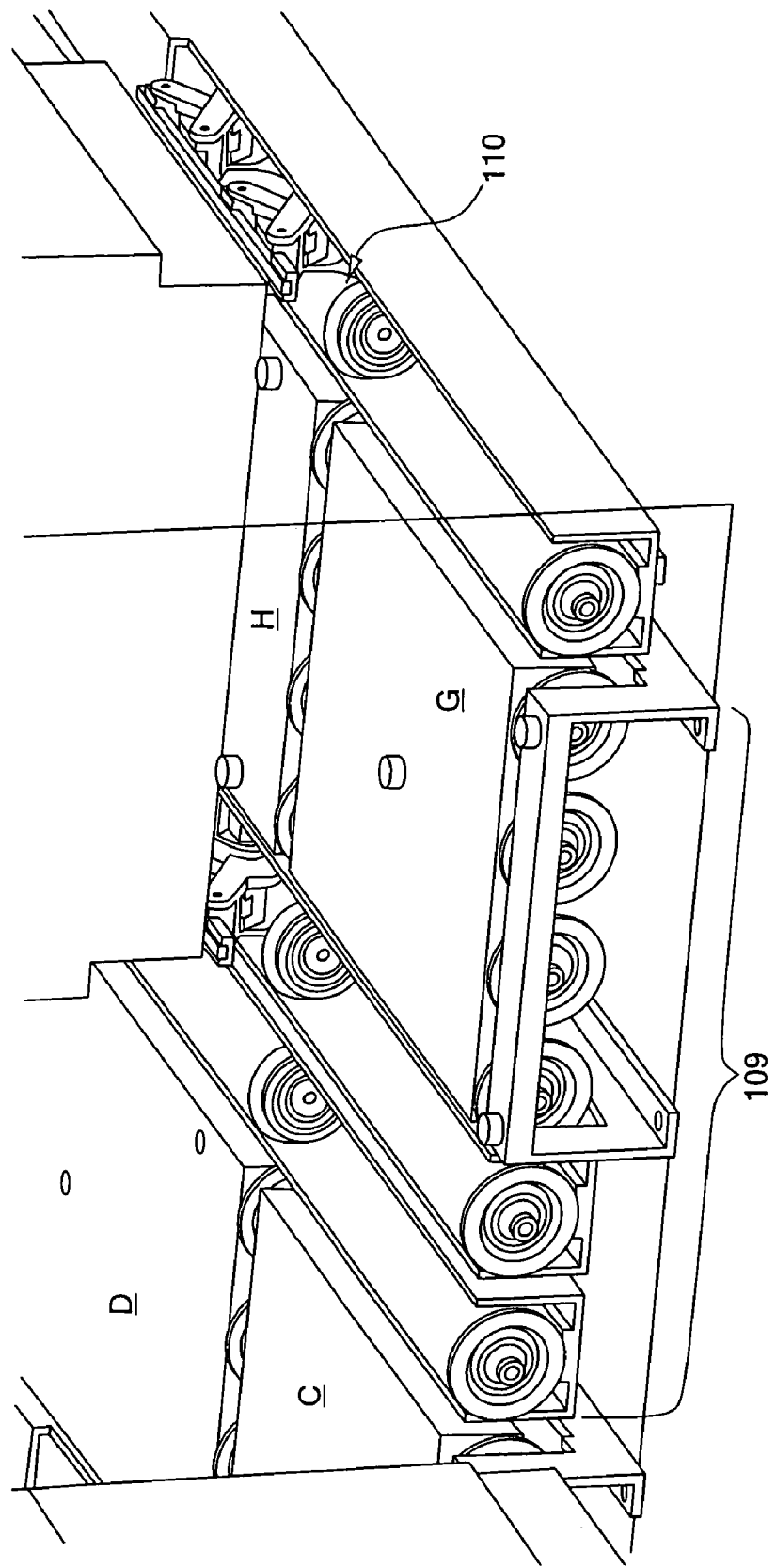
FIG. 6 is a perspective view of the extractor/buffer apparatus of FIG. 1, illustrating a plurality of representative roller mechanisms.

Specifically, the extractor/buffer assembly 102 comprises a plurality of extractor/buffer modules such as a module 104 (see FIG. 1). In the illustrated embodiment, the extractor/buffer assembly 102 includes six extractor/buffer modules like the module 104. Each extractor/buffer module includes a substantially planar platform, e.g., a platform 130, configured to hold two adjacent FOUPs, e.g., the FOUPs 116–117, thereby forming a "double nest" platform. Each extractor/buffer module further includes two elongated extractor arms, e.g., extractor arms 106–107 (see also FIG. 4), longitudinally disposed at opposing edges of the double nest platform, and a common linear axis drive mechanism 132 for simultaneously translating the extractor arms of each extractor/buffer module along a translation axis, e.g., an axis 114. Each extractor/buffer module has a plurality of independent lifting mechanisms, e.g., lifting mechanisms 120–121 (see also FIGS. 4 and 5a–5b), configured to lift respective FOUPs on the extractor arms, and a plurality of independent roller mechanisms, e.g., roller mechanisms 110–111 (see also FIG. 6), configured to move respective FOUPs on the double nest platform in a direction transverse to the translation axis 114.

It should be appreciated, however, that the extractor/buffer assembly 102 may include any suitable number of extractor/buffer modules. Further, each extractor/buffer module may be configured to handle any suitable number of FOUPs. For purposes of illustration, each extractor/buffer module described herein interfaces with a storage location that is two-FOUPs deep, as depicted in FIG. 1.

It should further be appreciated that the automated material handling systems described herein operate under computerized control. For example, the automated material handling systems may comprise a computer system including one or more processors for executing instructions out of a memory. The instructions executed in performing the operations described herein may comprise instructions stored as program code considered part of an operating system, instructions stored as program code considered part of an application, or instructions stored as program code allocated between the operating system and the application. Further, the memory may comprise Random Access Memory (RAM), a combination of RAM and Read Only Memory (ROM), or any other suitable program storage.

Figure 2:
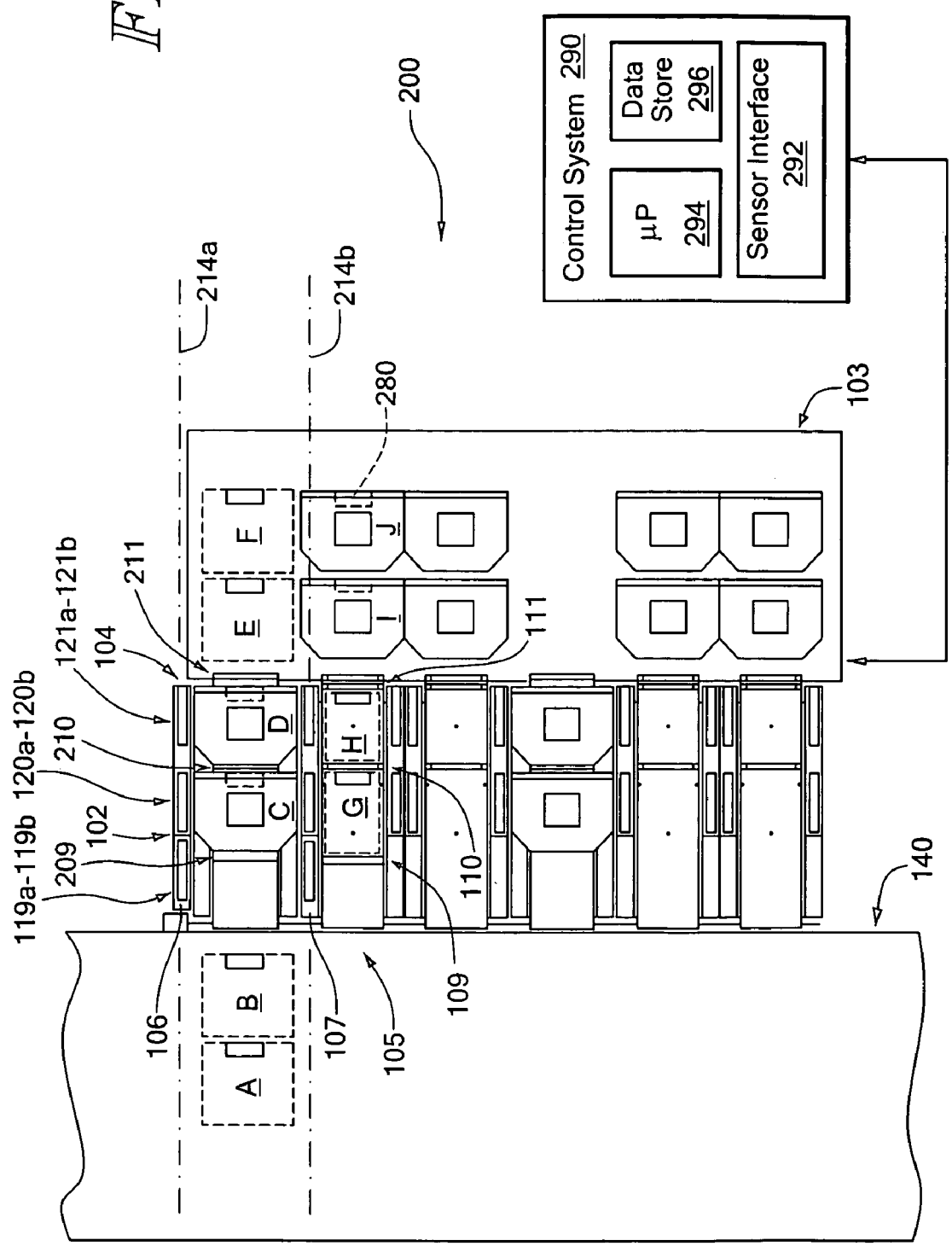
FIG. 2 is a plan view of an automated material handling system including the extractor/buffer apparatus of FIG. 1, in which the extractor/buffer apparatus provides an interface between storage locations and transport equipment for work-in-process parts.

FIG. 2 depicts an illustrative embodiment of an AMHS 200, in which the extractor/buffer assembly 102 is employed as an interface between the WIP storage unit 103 and a conveyor apparatus 140. As shown in FIG. 2, the storage unit 103 is disposed on one side of the extractor/buffer assembly 102, and the conveyor 140 is disposed on the opposite-side of the assembly 102. For example, the conveyor 140 may comprise a conveyor belt, or a platform configured to travel along a rail, as described in the above-referenced U.S. patent application Ser. No. 10/682,809. It should be understood, however, that the conveyor 140 may comprise any suitable type of transport equipment for moving WIP parts in a product manufacturing environment. For example, the conveyor 140 may alternatively comprise an overhead hoist transport vehicle of the type described in the above-referenced U.S. patent application Ser. No. 10/393,526 or U.S. patent application Ser. No. 10/682,809. Further, transport equipment such as the conveyor 140 may be disposed on either side or on both sides of the extractor/buffer assembly 102.

The operation of the extractor/buffer assembly 102 of FIGS. 1–2 will be better understood with reference to the following illustrative examples. First, to pick two FOUPs from locations E–F within the storage unit 103 and to place the two FOUPs to locations C–D on the extractor/buffer module 104, the extractor arms 106–107 move along respective translation axes 214a–214b from their positions alongside the double nest platform to corresponding positions alongside the locations E–F within the storage unit 103. Next, the lifting mechanisms on each extractor arm 106–107 (such as the lifting mechanisms 120a–120b, 121a–121b) lift the two FOUPs from the locations E–F, thereby picking the FOUPs from the storage unit 103. The extractor arms 106–107 then move along the respective translation axes 214a–214b back to their original positions relative to the double nest platform. Next, the lifting mechanisms 120a–120b, 121a–121b on the extractor arms 106–107 lower the two FOUPs to the locations C–D, thereby placing the FOUPs to the extractor/buffer module 104.

To pick a FOUP from the location F within the storage unit 103 and to place the FOUP to the location C on the extractor/buffer module 104, the extractor arms 106–107 move along the respective translation axes 214a–214b from their positions alongside the double nest platform to the corresponding positions alongside the locations E–F within the storage unit 103. Next, the lifting mechanisms 121a–121b lift the FOUP from the location F, and the extractor arms 106–107 move back along the respective translation axes 214a–214b to align the FOUP with the location E within the storage unit 103. Next, the lifting mechanisms 121a–121b lower the FOUP to the location E. The extractor arms 106–107 then move along the respective translation axes 214a–214b to their positions alongside the locations E–F. Next, the lifting mechanisms 120a–120b lift the FOUP from the location E, thereby picking the FOUP from the storage unit 103. The extractor arms 106–107 then move back along the respective translation axes 214a–214b to their original positions alongside the double nest platform, thereby aligning the FOUP with the location C on the extractor/buffer module 104. Finally, the lifting mechanisms 120a–120b lower the FOUP to the location C, thereby placing the FOUP to the module 104.

To pick a FOUP from the location F within the storage unit 103 and to place the FOUP to the location D on the extractor/buffer module 104, the extractor arms 106–107 move along the respective translation axes 214a–214b from their positions alongside the double nest platform to the corresponding positions alongside the locations E–F within the storage unit 103. Next, the lifting mechanisms 121a–121b lift the FOUP from the location F, thereby picking the FOUP from the storage unit 103. The extractor arms 106–107 then move back to their original positions alongside the double nest platform, thereby aligning the FOUP with the location D on the extractor/buffer module 104. Finally, the lifting mechanisms 121a–121b lower the FOUP to the location D, thereby placing the FOUP to the module 104.

To pick a FOUP from the location E within the storage unit 103 and to place the FOUP to the location D on the extractor/buffer module 104, the extractor arms 106–107 move along the respective translation axes 214a–214b from their positions alongside the double nest platform, thereby positioning the lifting mechanisms 121a–121b alongside the location E. Next, the lifting mechanisms 121a–121b lift the FOUP from the location E, thereby picking the FOUP from the storage unit 103. The extractor arms 106–107 then move back along the respective translation axes 214a–214b to their original positions alongside the double nest platform, thereby aligning the FOUP with the location D on the extractor/buffer module 104. Finally, the lifting mechanisms 121a–121b lower the FOUP to the location D, thereby placing the FOUP to the module 104. Such FOUP movements are normally performed when there is no FOUP disposed at the location F within the storage unit 103.

To pick a FOUP from the location F and to place the FOUP to the location E within the storage unit 103, the extractor arms 106–107 move along the respective translation axes 214a–214b from their positions alongside the double nest platform to the corresponding positions alongside the locations E–F. Next, the lifting mechanisms 121a–121b lift the FOUP from the location F, and the extractor arms 106–107 move back along the respective translation axes 214a–214b, thereby aligning the FOUP with the location E within the storage unit 103. The lifting mechanisms 121a–121b then lower the FOUP to the location E. The extractor arms 106–107 then move back to their original positions alongside the double nest platform of the extractor/buffer module 104. Such FOUP movements are normally performed when there is no FOUP disposed at the location E within the storage unit 103.

To pick a FOUP from the location E and to place the FOUP to the location F within the storage unit 103, the extractor arms 106–107 move along the respective translation axes 214a–214b from their positions alongside the double nest platform, thereby positioning the lifting mechanisms 121a–121b alongside the location E. Next, the lifting mechanisms 121a–121b lift the FOUP from the location E. The extractor arms 106–107 then move along the respective translation axes 214a–214b, thereby aligning the FOUP with the location F within the storage unit 103. Next, the lifting mechanisms 121a–121b lower the FOUP to the location F. The extractor arms 106–107 then move back to their original positions alongside the double nest platform of the extractor/buffer module 104. Such FOUP movements are normally performed when there is no FOUP disposed at the location F within the storage unit 103.

It should be noted that the extractor/buffer assembly 102 is operative to perform FOUP movements like those described in the above illustrative examples between locations A–B on the conveyor 140 and the locations C–D on the extractor/buffer module 104. For example, to pick two FOUPs from the locations A–B on the conveyor 140 and to place the two FOUPs to the locations C–D on the extractor/buffer module 104, the extractor arms 106–107 move along the respective translation axes 214a–214b from their positions alongside the double nest platform to corresponding positions alongside the locations A–B on the conveyor 140. Next, the lifting mechanisms on each extractor arm 106–107 (such as the lifting mechanisms 119a–119b, 120a–120b) lift the two FOUPs from the locations A–B, thereby picking the FOUPs from the conveyor 140. The extractor arms 106–107 then move along the respective translation axes 214a–214b back to their original positions relative to the double nest platform. Next, the lifting mechanisms 119a–119b, 120a–120b on the extractor arms 106–107 lower the two FOUPs to the locations C–D, thereby placing the FOUPs to the extractor/buffer module 104.

To move two FOUPs from the locations C–D on the extractor/buffer module 104 to locations G–H on an adjacent extractor/buffer module 105, i.e., in a direction transverse to the translation axes 214a–214b, roller mechanisms 209–211 operate to move the two FOUPs from the locations C–D toward the locations G–H, respectively. When the FOUPs start to overlap the extractor/buffer module 105, the roller mechanisms 109–111 operate in conjunction with the roller mechanisms 209–211 to align the two FOUPs with the locations G–H on the extractor/buffer module 105. It is noted that the roller mechanisms 109–111, 209–211 may also move the two FOUPs from the locations G–H on the extractor/buffer module 105 to the locations C–D on the extractor/buffer module 104.

Moreover, because each of the extractor/buffer modules have roller mechanisms like the roller mechanisms 109–111, 209–211, the extractor/buffer assembly 102 may be employed to reposition the FOUPs within the storage unit 103. For example, the extractor/buffer module 104 may be employed to move two FOUPs from the locations E–F within the storage unit 103 to the locations C–D on the extractor/buffer module 104. The roller mechanisms 109–111, 209–211 may then be employed to move the two FOUPs from the locations C–D to the locations G–H on the extractor/buffer module 105. Next, the extractor/buffer module 105 may be employed to move the two FOUPs from the locations G–H to locations I–J within the storage unit 103. As a result, the two FOUPs are repositioned within the storage unit 103 from the locations E–F to the locations I–J.

In the preferred embodiment, the AMHS 200 includes a plurality of proximity or presence sensors configured to detect the presence of a FOUP in each of the locations on the conveyor 140 (e.g., the locations A–B), on the extractor/buffer assembly 102 (e.g., the locations C–D and G–H), and within the WIP storage unit 103 (e.g., the locations E–F and I–J). As generally shown in FIG. 2, each of the locations A–J has at least one sensor associated therewith, e.g., the sensor 280 associated with the location J within the storage unit 103. For example, each proximity or presence sensor may comprise a capacitive sensor, a photoelectric sensor, an inductive sensor, a Hall effect sensor, an ultrasonic sensor, or any other suitable type of proximity or presence sensor. The AMHS 200 further includes a computerized control system 290 including a sensor interface 292, at least one processor 294, and at least one data store 296 such as RAM, ROM, a disk, and/or any other suitable type of data storage.

As described above, the plurality of sensors is configured to detect the presence of a FOUP in each of the locations on the conveyor 140, on the extractor/buffer assembly 102, and within the WIP storage unit 103. The control system 290 is operative to read signal inputs provided to the sensor interface 292 by the plurality of sensors. Each signal input provided by the sensors comprises information indicating whether or not the location associated therewith has a FOUP disposed thereon, i.e., the signal inputs indicate whether or not the locations are "empty" or "full". The control system 290 is further operative to maintain a database in the data store 296, and to access the database to determine whether or not the respective locations are currently empty or full. By accessing empty/full information stored in the database and picking/placing FOUPs to known locations on the conveyor, on the extractor/buffer assembly, and within the storage unit based on the accessed information, the AMHS 200 can pick, place, and reposition FOUPs with increased efficiency while reducing errors and inadvertent damage to the FOUPs.

Figure 3:
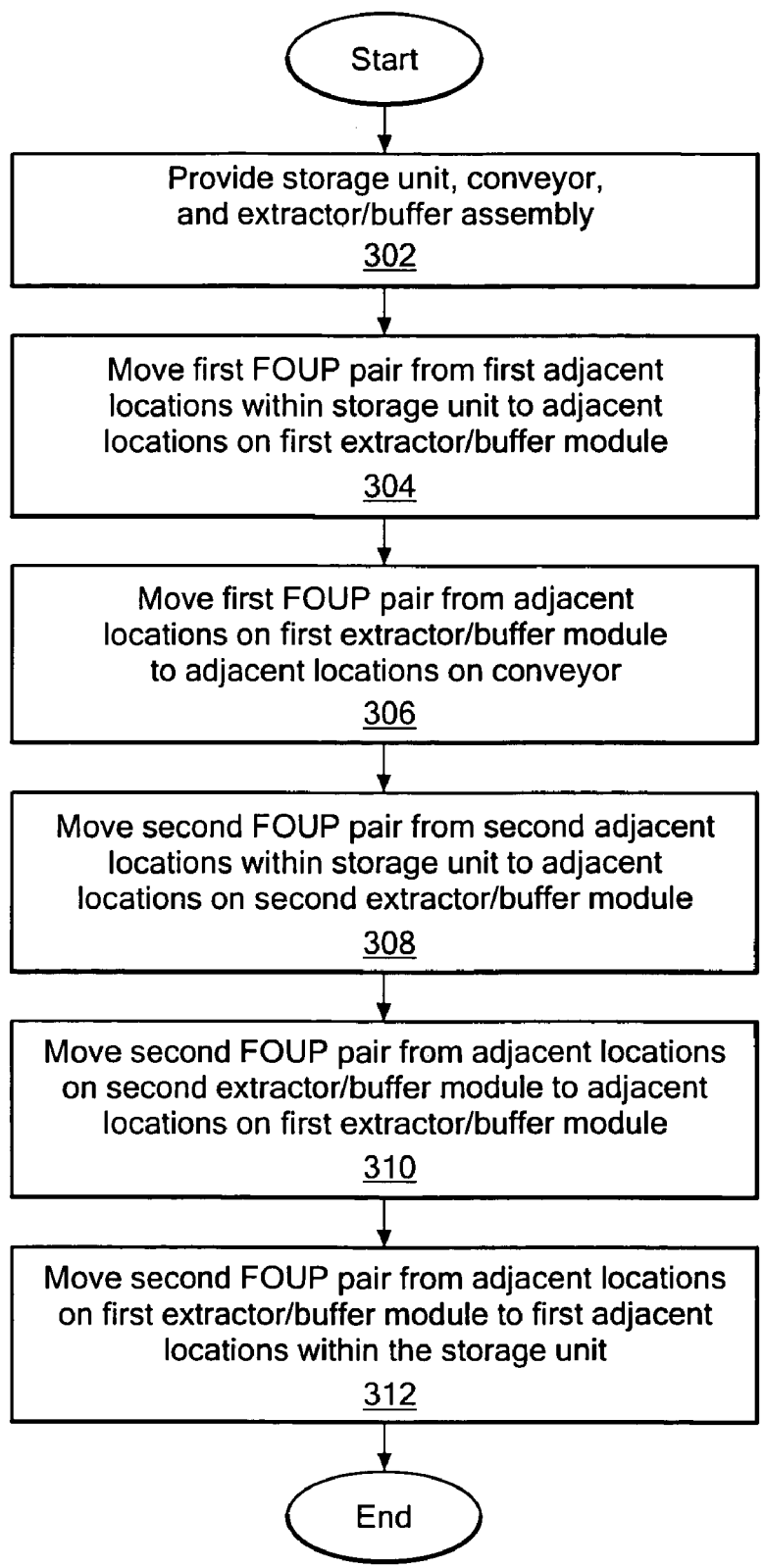
FIG. 3 is a flow diagram of a method of operating an automated material handling system including the extractor/buffer apparatus of FIG. 1.

A method of operating the presently disclosed automated material handling system including the improved extractor/buffer assembly is illustrated by reference to FIG. 3. As depicted in step 302, a storage unit including storage locations that are two-WIP parts deep, a conveyor apparatus, and an extractor/buffer assembly disposed between the storage unit and the conveyor are provided. Next, a first extractor/buffer module included in the extractor/buffer assembly moves, as depicted in step 304, a first pair of FOUPs from a first pair of adjacent locations within the storage unit to a pair of adjacent locations on the first module. The first extractor/buffer module then moves the first FOUPs, as depicted in step 306, from the locations on the first module to a pair of adjacent locations on the conveyor. Next, a second extractor/buffer module adjacent the first module in the extractor/buffer assembly moves, as depicted in step 308, a second pair of FOUPs from a second pair of adjacent locations within the storage unit to a pair of adjacent locations on the second module. The second extractor/buffer module then moves the second FOUPs, as depicted in step 310, from the locations on the second module to the locations on the first module. Finally, the first extractor/buffer module moves the second FOUPs, as depicted in step 312, from the locations on the first module to the first pair of locations within the storage unit.

It will be appreciated that a single extractor/buffer module or an extractor/buffer assembly including multiple modules may be configured to interface with WIP storage locations at any elevation in the product manufacturing environment, e.g., at a table-top level, at an overhead level, or at a level beneath a raised floor. For example, the extractor/buffer assembly may interface with a vertical carousel storage unit at the table-top level or at the level underneath a raised floor. Further, the vertical carousel storage unit may rotatably position different storage bins at the table-top or sub-floor level for subsequent access by the extractor/buffer assembly.

In addition, the extractor/buffer assembly may interface with an overhead hoist transport vehicle at the overhead level. In this case, the extractor arms of an extractor/buffer module disposed beside the overhead transport vehicle may move laterally to a position substantially directly underneath an overhead hoist within the transport vehicle. Next, the overhead hoist may pick/place a FOUP directly from/to the extractor arms, which may then move back to their original positions on the extractor/buffer module. Once the FOUP is held by the overhead hoist, the overhead hoist transport vehicle may move it to a workstation or processing machine on the IC chip manufacturing floor.

The extractor/buffer assembly may also interface with a shelf array including multiple rows of fixed shelves. For example, each fixed shelf in the shelf array may comprise a storage location that is two-FOUPs deep. Further, the extractor/buffer assembly may be configured to move to a selected row at a respective level in the shelf array to pick/place one or more FOUPs from/to that storage location. Such a shelf array is described in the above-referenced U.S. patent application Ser. No. 10/682,809.

Having described the above illustrative embodiments, other alternative embodiments or variations may be made. For example, it was described that the automated material handling systems 100 and 200 may be employed in an IC chip manufacturing environment. However, it should be appreciated that the above-described automated material handling systems may be employed in any suitable environment in which articles are stored and moved from place to place. For example, the automated material handling systems described herein may be employed in an automobile manufacturing facility, and the WIP parts stored and moved by the system may comprise automobile parts.

It will further be appreciated by those of ordinary skill in the art that modifications to and variations of the above-described extractor/buffer may be made without departing from the inventive concepts disclosed herein. Accordingly, the invention should not be viewed as limited except as by the scope and spirit of the appended claims.

What is claimed is:

1. A material unit transfer apparatus for moving plurality of material units between transport equipment and plurality of material unit storage locations, for use in an automated material handling system, the apparatus comprising:
    a first substantially planar platform configured to hold at least two material units;
    a first transfer mechanism operatively coupled to the first platform, said first transfer mechanism being configured and operable to move one or more material units between the first platform and the transport equipment or the storage locations in a direction of a first axis; and
    a second transfer mechanism operatively coupled to the first platform, said second transfer mechanism being configured and operable to move one or more material units between the first platform and a second substantially planar platform adjacent the first platform in a direction of a second axis, the second axis being disposed at substantially a right angle to the first axis, wherein said second transfer mechanism includes at least two second transfer sub-mechanisms, each of said at least two second transfer sub-mechanisms being configured to operate independent of each of the other said at least two second transfer sub-mechanisms to move a respective one of said one or more material units between the first and second platforms.

2. The material unit transfer apparatus of claim 1 wherein the first transfer mechanism includes at least one elongated member configured to translate in a direction of the first axis for accessing one or more material units directly from the transport equipment or the storage location.

3. The material unit transfer apparatus of claim 2 wherein the first transfer mechanism further includes a first drive mechanism configured to drive the at least one elongated member while the elongated member translates in a direction to of the first axis.

4. The material unit transfer apparatus of claim 1 wherein the first transfer mechanism includes two elongated members operatively coupled to the first substantially planar platform near opposing edges of the first platform.

5. The material unit transfer apparatus of claim 4 wherein the two elongated members are configured to translate simultaneously in a direction of the first axis for accessing one or more material units directly from the transport equipment or the storage location.

6. The material unit transfer apparatus of claim 4 wherein the first transfer mechanism further includes a first drive mechanism configured to drive the two elongated members while the elongated members translate in a direction of the first axis.

7. The material unit transfer apparatus of claim 1 wherein the second transfer mechanism includes at least one roller assembly.

8. The material unit transfer apparatus of claim 7 wherein the second transfer mechanism includes a plurality of roller assemblies, each roller assembly being configured to move a respective material unit between the first platform and the second platform in a direction of the second axis.

9. The material unit transfer apparatus of claim 8 wherein the second platform is included in a second material unit transfer apparatus configured to move at least one material unit between the transport equipment and at least one material unit storage location.

10. The material unit transfer apparatus of claim 8 wherein the plurality of roller assemblies is configured to move simultaneously the respective material units between the first and second platforms.

11. The material unit transfer apparatus of claim 10 wherein the second platform is included in a second material unit transfer apparatus configured to move at least one material unit between the transport equipment and at least one material unit storage location.

12. The material unit transfer apparatus of claim 1 further including a third transfer mechanism configured and operable to move one or more material units in a direction of a third axis disposed at substantially right angles to the first and second axes,
wherein said third transfer mechanism includes at least two third transfer sub-mechanisms, each of said at least two third transfer sub-mechanisms being configured to operate independent of the other third transfer sub-mechanism to move a respective one of said one or more material units in a direction of the third axis.

13. The material unit transfer apparatus of claim 12 wherein each of said at least two third transfer sub-mechanisms comprises a respective lift assembly, each respective lift assembly being configured and operable to lift said respective one of said one or more material units from a selected one of the first platform and the transport equipment or the storage locations in a direction of the third axis.

14. The material unit transfer apparatus of claim 1 wherein the material unit comprises a cassette pod.

15. The material unit transfer apparatus of claim 14 wherein the cassette pod comprises a front opening unified pod.

16. The material unit transfer apparatus of claim 1 wherein the transport equipment is selected from the group consisting of a conveyor and an overhead hoist transport vehicle.

17. The material unit transfer apparatus of claim 1 wherein the at least one material unit storage location is disposed in a storage unit selected from the group consisting of a stocker and a vertical carousel storage unit.

18. The material unit transfer apparatus of claim 1 wherein the at least one material unit storage location is disposed on one or more fixed shelves.

19. An automated material handling system, comprising:
one or more storage locations, each storage location being configured to hold at least one material unit;
transport equipment configured to move one or more material units between a plurality of predetermined sites; and
a material unit transfer assembly for moving one or more material units between the transport equipment and the one or more storage locations, the material unit transfer assembly including a plurality of material unit transfer apparatuses, each material unit transfer apparatus as recited in claim 1,
the plurality of material unit transfer apparatuses being arranged side-by-side within a plane defined by first and second orthogonal axes to allow a first transfer mechanism included in each apparatus to move in a direction of the first axis at least one material unit between the respective apparatus and at least one storage location or the transport equipment, and to allow a second transfer mechanism included in each apparatus to move in a direction of the second axis at least one material unit between the respective apparatus and an adjacent material unit transfer apparatus within the assembly.

20. The system of claim 19 wherein the first transfer mechanism of each material unit transfer apparatus includes at least one elongated member configured to translate in a direction of the first axis for accessing the at least one material unit directly from the storage location or the transport equipment, the material unit transfer assembly further including a common drive mechanism configured for simultaneously driving the at least one elongated member of the respective material unit transfer apparatus.

21. The system of claim 19 wherein the material unit comprises a cassette pod.

22. The system of claim 21 wherein the cassette pod comprises a front opening unified pod.

23. The system of claim 19 wherein the transport equipment is selected from the group consisting of a conveyor and an overhead hoist transport vehicle.

24. The system of claim 19 wherein the one or more material unit storage locations are disposed in a storage unit selected from the group consisting of a stocker and a vertical carousel storage unit.

25. The system of claim 19 wherein the one or more material unit storage locations are disposed on one or more fixed shelves.

26. The system of claim 19 wherein the transport equipment and each material unit transfer apparatus has at least one location associated therewith for holding at least one material unit, and further including
a plurality of sensors configured to detect the presence of respective material units in each storage location and in each location associated with the transport equipment and the material unit transfer apparatuses, and to provide signals indicative of whether a respective material unit is present in each of the locations, and
a controller operative to receive the signals provided by the sensors and to control the movement of the material units based on the received sensor signals.

27. The system of claim 26 wherein the controller is further operative to maintain a database indicating whether a respective material unit is present in each storage location and in each location associated with the transport equipment and the material unit transfer apparatuses.

28. A method of operating an automated material handling system, comprising the steps of:
providing one or more storage locations, each storage location for holding one or more material units;
providing transport equipment for moving one or more material units between a plurality of predetermined sites;
providing a material unit transfer assembly for moving one or more material units between the transport equipment and the one or more storage locations, the assembly including a plurality of material unit transfer apparatuses, each material unit transfer apparatus as recited in claim 1, the plurality of material unit transfer apparatuses being arranged side-by-side within a plane defined by first and second orthogonal axes;
moving one or more material units between a first material unit transfer apparatus and the transport equipment or the one or more storage locations in a direction of the first axis by a first transfer mechanism included in the first transfer apparatus; and
moving one or more material units between the first transfer apparatus and a second material unit transfer apparatus adjacent the first transfer apparatus within the assembly in a direction of the second axis by a second transfer mechanism included in the first transfer apparatus.

29. The method of claim 28 further including the step of moving one or more material units from the second material unit transfer apparatus to the transport equipment or one or more second storage locations in a direction of the first axis by a first transfer mechanism included in the second transfer apparatus.

30. The method of claim 28 wherein the first moving step includes extracting one or more material units from one or more first storage locations in a direction of the first axis for subsequent transfer to a first substantially planar platform included in the first material unit transfer apparatus.

31. The method of claim 30 wherein the second moving step includes moving the one or more material units from the first platform of the first transfer apparatus to a second substantially planar platform included in the second material unit transfer apparatus adjacent the first transfer apparatus in a direction of the second axis.

32. The method of claim 31 further including the step of moving the one or more material units from the second platform of the second transfer apparatus to one or more second storage locations in a direction of the first axis by a first transfer mechanism included in the second transfer apparatus.

33. The method of claim 28 wherein the material unit comprises a cassette pod.

34. The method of claim 33 wherein the cassette pod comprises a front opening unified pod.

35. The method of claim 28 wherein the transport equipment is selected from the group consisting of a conveyor and an overhead hoist transport vehicle.

36. The method of claim 28 wherein the at least one material unit storage location is disposed in a storage unit selected from the group consisting of a stocker and a vertical carousel storage unit.

37. The method of claim 28 wherein the at least one material unit storage location is disposed on one or more fixed shelves.

38. The method of claim 28 wherein the transport equipment and each material unit transfer apparatus has at least one location associated therewith for holding at least one material unit, and further including the steps of detecting the presence of respective material units in each storage location and in each location associated with the transport equipment and the material unit transfer apparatuses by a plurality of sensors, providing signals indicative of whether a respective material unit is present in each of the locations by the plurality of sensors, receiving the sensor signals by a controller, and controlling the movement of the material units based on the received sensor signals by the controller.

39. The method of claim 38 further including the step of maintaining a database indicating whether a respective material unit is present in each storage location and in each location associated with the transport equipment and the material unit transfer apparatuses by the controller.

* * * * *

UNITED STATES PATENT AND TRADEMARK OFFICE
CERTIFICATE OF CORRECTION

PATENT NO.       : 7,101,138 B2
APPLICATION NO.  : 10/727353
DATED            : September 5, 2006
INVENTOR(S)      : William John Fosnight et al.

It is certified that error appears in the above-identified patent and that said Letters Patent is hereby corrected as shown below:

Column 10, claim 3, line 40, "to of the first" should read --of the first--.

Signed and Sealed this

Seventeenth Day of July, 2007

JON W. DUDAS
*Director of the United States Patent and Trademark Office*